US010534045B2

(12) United States Patent
Green et al.

(10) Patent No.: US 10,534,045 B2
(45) Date of Patent: Jan. 14, 2020

(54) VERTICAL HALL-EFFECT SENSOR FOR DETECTING TWO-DIMENSIONAL IN-PLANE MAGNETIC FIELDS

(71) Applicant: Texas Instruments Incorporated, Dallas, TX (US)

(72) Inventors: Keith Ryan Green, Prosper, TX (US); Byron Jon Roderick Shulver, Murphy, TX (US); Iouri Mirgorodski, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 69 days.

(21) Appl. No.: 15/709,866

(22) Filed: Sep. 20, 2017

(65) Prior Publication Data

US 2019/0086484 A1 Mar. 21, 2019

(51) Int. Cl.
*G01R 33/07* (2006.01)
*G01R 33/00* (2006.01)
*H01L 43/14* (2006.01)
*H01L 27/22* (2006.01)
*G01D 5/14* (2006.01)

(52) U.S. Cl.
CPC .......... *G01R 33/077* (2013.01); *G01D 5/145* (2013.01); *G01R 33/0005* (2013.01); *G01R 33/0052* (2013.01); *H01L 27/22* (2013.01); *H01L 43/14* (2013.01)

(58) Field of Classification Search
CPC ......... G01R 33/77; G01R 33/05; G01R 33/52
See application file for complete search history.

(56) References Cited

U.S. PATENT DOCUMENTS

| 6,545,462 | B2 | 4/2003 | Schott |
| 7,511,484 | B2 | 3/2009 | Oohira |
| 8,357,983 | B1* | 1/2013 | Wang ............... G01R 33/07 257/257 |
| 9,103,868 | B2 | 8/2015 | Ausserlechner |
| 9,134,383 | B2 | 9/2015 | Fujita |
| (Continued) | | | |

FOREIGN PATENT DOCUMENTS

JP   2006165492   6/2006

OTHER PUBLICATIONS

Maenaka, Novel Vertical Hall Cells in Standard Bipolar Technology, in Electronics Letters, Oct. 8, 1987, vol. 23, No. 21.

(Continued)

*Primary Examiner* — Dominic E Hawkins
(74) *Attorney, Agent, or Firm* — Andrew R. Ralston; Charles A. Brill; Frank D. Cimino

(57) ABSTRACT

A microelectronic device includes a vertical Hall sensor for measuring magnetic fields in two dimensions. In one implementation, the disclosed microelectronic device involves a vertical Hall plate with a cross-shaped upper terminal and a lower terminal which includes a buried layer. The cross-shaped upper terminal has a length-to-width ratio of 5 to 12 where it contacts the vertical Hall plate. The length is measured from one end of one arm of the cross-shaped upper terminal to an opposite end of an opposite arm. The width is an average width of both arms. Hall sense taps are located outside of the cross-shaped upper terminal. Current returns connect to the buried layer.

20 Claims, 13 Drawing Sheets

(56) References Cited

U.S. PATENT DOCUMENTS

| | | |
|---|---|---|
| 9,261,572 B2 | 2/2016 | Ausserlechner |
| 9,523,745 B2 | 12/2016 | Hioka |
| 2001/0042892 A1* | 11/2001 | Okada .............. H01L 21/76802 |
| | | 257/382 |
| 2014/0361766 A1 | 12/2014 | Röhrer |
| 2015/0346289 A1 | 12/2015 | Ausserlechner |
| 2016/0011281 A1 | 1/2016 | Sander |
| 2016/0018478 A1* | 1/2016 | Hebert ................ G01R 33/077 |
| | | 257/421 |
| 2016/0209480 A1* | 7/2016 | Hioka ................. G01R 33/075 |
| 2017/0062704 A1* | 3/2017 | Kolb ..................... G01R 33/07 |
| 2017/0358736 A1* | 12/2017 | Majoni .................. H01L 43/14 |
| 2018/0198061 A1* | 7/2018 | Toh ...................... H01L 43/065 |

OTHER PUBLICATIONS

Nakamura, Integrated Magnetic Sensors, in Sensors and Actuators, A21-A23, 1990, 762-769.

* cited by examiner

VERTICAL HALL-EFFECT SENSOR FOR DETECTING TWO-DIMENSIONAL IN-PLANE MAGNETIC FIELDS

FIELD

This disclosure relates to the field of microelectronic devices. More particularly, this disclosure relates to Hall sensors in microelectronic devices.

BACKGROUND

Sensing magnetic fields in two dimensions using microelectronic devices involves tradeoffs between sensitivity and cost. Hall effect sensors provide low cost solutions, because the Hall plates can be integrated into conventional integrated circuits, but sensitivity of two-dimensional magnetic field sensors has been lacking. In particular, reducing resistance of the Hall cell to reduce power consumption while increasing sensitivity has been problematic.

SUMMARY

The present disclosure introduces a microelectronic device for measuring magnetic fields in two dimensions using a vertical Hall sensor. In one implementation, the disclosed microelectronic device involves a vertical Hall plate with a cross-shaped upper terminal contacting a top of the vertical Hall plate, and a buried layer contacting a bottom of the vertical Hall plate. The cross-members of the upper terminal have length-to-width ratios of 5 to 12. Hall sense taps are located around a periphery of the vertical Hall plate. Advantageously, the vertical Hall sensor provides higher sensitivity-to-resistance ratios compared to other two-dimension vertical Hall sensor configurations.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device includes a two-dimensional (2D) vertical Hall cell for measuring magnetic fields in two dimensions in a plane of a top surface of the microelectronic device. The 2D vertical Hall cell has a vertical Hall plate with a cross-shaped upper terminal contacting a top of the vertical hall plate, and a buried layer contacting a bottom of the vertical Hall plate. The cross-shaped upper terminal may have an average electrical conductivity at least 10 times an average electrical conductivity of the vertical Hall plate. The buried layer has an average electrical conductivity at least 10 times an average electrical conductivity of the vertical Hall plate. Electrical conductivity may be expressed in units of ohm$^{-1}$ cm$^{-1}$. The cross-members of the upper terminal have length-to-width ratios of 5 to 12. Hall sense taps are located around a periphery of the vertical Hall plate. The microelectronic device may advantageously be implemented in a semiconductor substrate as part of an integrated circuit.

For the purposes of this disclosure, the terms "lateral" and "laterally" are understood to refer to a direction parallel to a plane of the top surface of substrate. The term "vertical" is understood to refer to a direction perpendicular to the plane of the top surface of the substrate. It is noted that terms such as top, bottom, over, and under may be used in this disclosure. These terms should not be construed as limiting the position or orientation of a structure or element, but should be used to provide spatial relationship between structures or elements.

Figure 1:
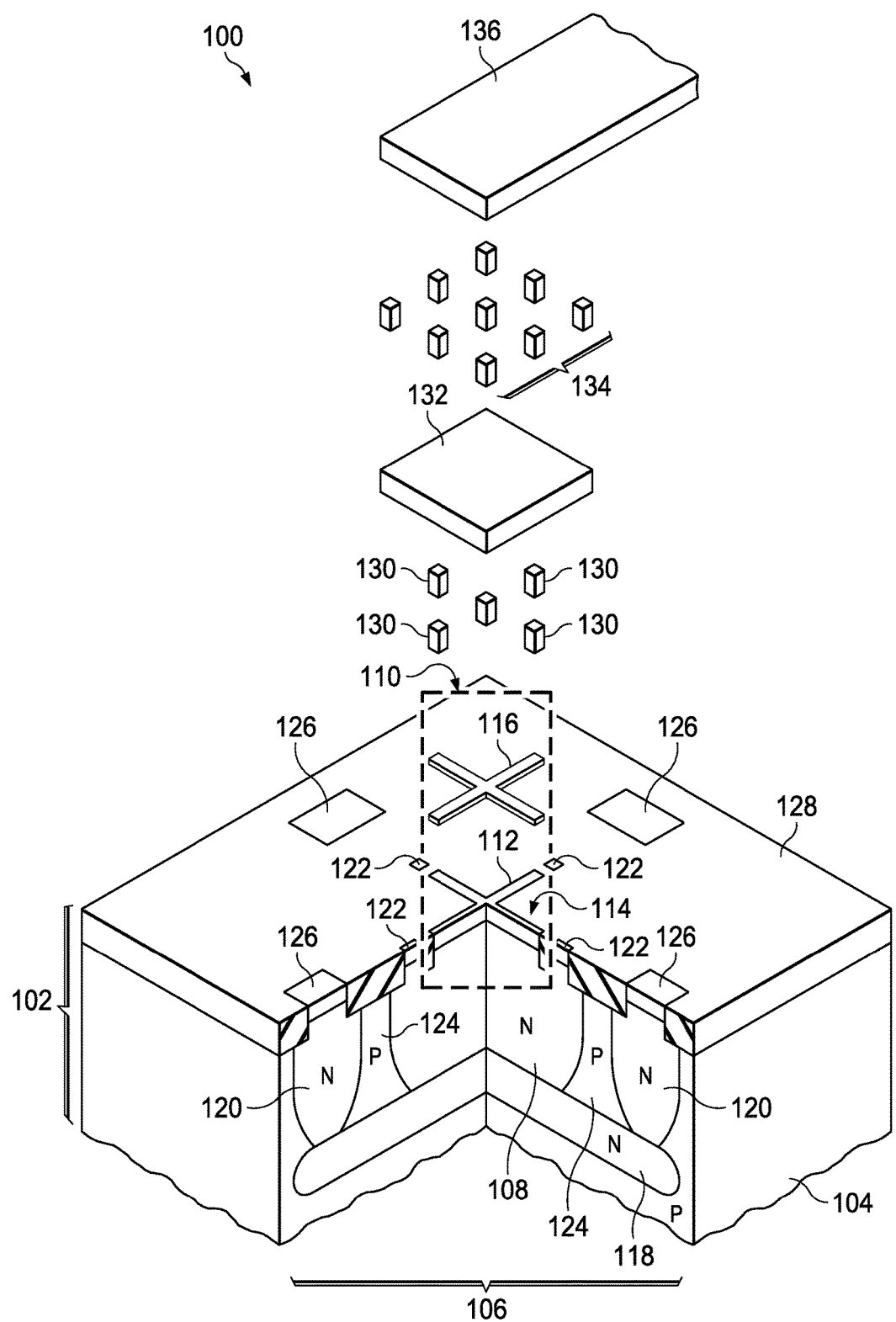
FIG. 1 is an exploded view of an example microelectronic device including a 2D vertical Hall cell.

FIG. 1 is an exploded view of an example microelectronic device including a 2D vertical Hall cell. The microelectronic device 100 includes a substrate 102 with semiconductor material 104. In the instant example, the semiconductor material 104 may be p-type, as indicated in FIG. 1. The substrate 102 may be part of a semiconductor wafer, or other material suitable for the microelectronic device 100.

The 2D vertical Hall cell 106 includes a vertical Hall plate 108 of semiconductor material in the substrate 102. In the instant example, the vertical Hall plate 108 may be n-type, as indicated in FIG. 1. The vertical Hall plate 108 may have an average dopant density of, for example, 1×10$^{15}$ cm$^{-3}$ to 5×10$^{16}$ cm$^{-3}$. Lower average dopant densities tend to increase the sensitivity, but also increase the resistance, of the 2D vertical Hall cell 106. A desired maximum ratio of magnetic field measurement sensitivity to resistance may be attained by having the average dopant density of the vertical Hall plate 108 from 1×10$^{15}$ cm$^{-3}$ to 5×10$^{16}$ cm$^{-3}$.

The 2D vertical Hall cell 106 further includes a cross-shaped upper terminal 110 over the vertical Hall plate 108. During operation of the microelectronic device 100, the cross-shaped upper terminal 110 distributes current uniformly at an interface between the cross-shaped upper terminal 110 and the vertical Hall plate 108, into the vertical Hall plate 108. In the instant example, the cross-shaped upper terminal 110 includes an upper contact region 112 in the substrate 102, the upper contact region 112 having a cross-shaped area extending to a top surface 114 of the substrate 102. The upper contact region 112 has a same conductivity type as the vertical Hall plate 108, which in the instant example is n-type. The upper contact region 112 directly contacts the vertical Hall plate 108. In one aspect of the instant example, the upper contact region 112 may have an average electrical conductivity at least 10 times greater than an average electrical conductivity of the vertical Hall plate 108, to provide a desired uniformity of current into the vertical Hall plate 108. In another aspect, the upper contact region 112 may have an average dopant density at least 100 times the average dopant density of the vertical Hall plate 108, to provide the desired uniformity of current into the vertical Hall plate 108. In the instant example, the cross-shaped upper terminal 110 may also include metal silicide 116 directly on the upper contact region 112. The metal silicide 116 may include, for example, platinum silicide, titanium silicide, cobalt silicide, or nickel silicide. The metal silicide 116 may extend over the upper contact region 112 and be coterminous with the upper contact region 112, as a result of being formed by a self-aligned silicide process. The metal silicide 116 may have a higher electrical conductivity than the upper contact region 112, and so may further improve the uniformity of current into the vertical Hall plate 108. A length of the cross-shaped upper terminal 110, where it contacts the vertical Hall plate 108, from one end of a first arm to a corresponding end of a second, opposite, arm, is 5 to 12 times an average width of the first and second arms. Similarly, a length of the cross-shaped upper terminal 110, where it contacts the vertical Hall plate 108, from one end of a third arm to a corresponding end of a fourth, opposite, arm, is 5 to 12 times an average width of the third and fourth arms, the third and fourth arms being perpendicular to the first and second arms. In the instant example, the cross-shaped upper terminal 110 contacts the vertical Hall plate 108 at a bottom of the upper contact region 112, hence a length of the upper contact region 112 along the first and second arms is 5 to 12 times an average width of the upper contact region 112 along the first and second arms, and similarly for the upper contact region 112 along the third and fourth arms. The cross-shaped upper terminal 110 has an average electrical conductivity at least 10 times greater than the average electrical conductivity of the vertical Hall plate 108, to provide the desired uniformity of current into the vertical Hall plate 108.

The 2D vertical Hall cell 106 also includes a buried layer 118 in the substrate 102 under the vertical Hall plate 108. The buried layer 118 has a same conductivity type as the vertical Hall plate 108, which in the instant example is n-type. The buried layer 118 directly contacts the vertical Hall plate 108 and extends laterally past the vertical Hall plate 108 to current return regions 120 located in the substrate 102 outside of the vertical Hall plate 108. A top surface of the buried layer 118 may be, for example, 3 microns to 5 microns below the top surface 114 of the substrate 102. A deeper buried layer 118 or a shallower buried layer 118 is within the scope of the instant example. (The buried layer 118 has an average electrical conductivity at least 10 times greater than an average electrical conductivity of the vertical Hall plate 108. In one aspect of the instant example, the buried layer 118 may have an average dopant density at least 10 times greater than an average dopant density of the vertical Hall plate 108.

The 2D vertical Hall cell 106 includes Hall sense taps 122 which contact the vertical Hall plate 108. In the instant example, the Hall sense taps 122 may be located at the top surface 114 of the substrate, proximate to the cross-shaped upper terminal 110. The Hall sense taps 122 may include tap contact regions having the same conductivity type as the vertical Hall plate 108 and substantially similar dopant distributions as the upper contact region 112, as a result of being formed concurrently.

The current return regions 120 may have the same conductivity type as the vertical Hall plate 108. In the instant example, the current return regions 120 may extend from the buried layer 118 upward toward the top surface 114 of the substrate 102, to return contact regions 126 in the substrate 102. In one aspect of the instant example, the current return regions 120 may have dopant distributions similar to the vertical Hall plate 108, as a result of being formed concurrently. In another aspect, the current return regions 120 may have average dopant densities significantly greater than that of the vertical Hall plate 108, to reduce a total resistance of the 2D vertical Hall cell 106. The return contact regions 126 have the same conductivity type as the current return regions 120. The return contact regions 126 may extend to the top surface 114 of the substrate 102, and may have substantially similar dopant distributions as the upper contact region 112, as a result of being formed concurrently. The current return regions 120 may be laterally isolated from the vertical Hall plate 108 by p-type semiconductor material 124 of the substrate 102, which may advantageously reduce fabrication cost and complexity of the microelectronic device 100 compared to using more complicated isolation structures. Other structures for laterally isolating the current return regions 120 from the vertical Hall plate 108, such as trenches having dielectric fill material, are within the scope of the instant example.

The upper contact region 112, the Hall sense taps 122, and the return contact regions 126 may be laterally separated by field oxide 128. The field oxide 128 may have a shallow trench isolation (STI) structure with near-vertical lateral profiles as depicted in FIG. 1, as a result of being formed by an STI process. Alternatively, the field oxide 128 may be formed by a local oxidation of silicon (LOCOS) process and have tapered lateral profiles.

The 2D vertical Hall cell 106 may include contacts 130 distributed along the cross-shaped upper terminal 110, a metal pad 132 of a first interconnect level on the contacts 130, vias 134 distributed on the metal pad 132, and a current source lead 136 of a second interconnect level on the vias 134. The contacts 130 may have a density and spatial distribution to advantageously reduce a total resistance of the 2D vertical Hall cell 106. For example, the contacts 130 may extend to ends of the cross-shaped upper terminal 110. Similarly, the vias 134 may be configured to further reduce the total resistance.

During operation of the microelectronic device 100, current is provided to the cross-shaped upper terminal 110 through the current source lead 136, the vias 134, the metal pad 132, and the contacts 130. The cross-shaped upper terminal 110 advantageously provides a uniform current distribution into the vertical Hall plate 108, due to the electrical conductivity of the cross-shaped upper terminal 110 being significantly greater, for example, at least 10 times greater, than that in the vertical Hall plate 108. The current flows downward through the vertical Hall plate 108 to the buried layer 118. Because the electrical conductivity of the buried layer 118 is at least 10 times than that in the vertical Hall plate 108, the current through the vertical Hall plate 108 may maintain a cross-shaped profile from the upper contact region 112 to the buried layer 118. The current flows through the buried layer 118 to the current return regions 120, and then up the current return regions 120 to the return contact regions 126. A magnetic field with a component parallel to the top surface 114 of the substrate 102 may cause lateral deflection of the current through the vertical Hall plate 108, producing a voltage differential between pairs of the Hall sense taps 122 located opposite from each other across the vertical Hall plate 108. The voltage differentials may be used to estimate a magnitude and orientation of the component of the magnetic field that is parallel to the top surface 114 of the substrate 102. The configuration of the 2D vertical Hall cell 106, wherein Hall voltages in perpendicular directions are measured using the vertical Hall plate 108, may advantageously enable a compact layout of the 2D vertical Hall cell 106 compared to configurations using separate Hall plates for each measurement direction. The aspect ratio of the cross-shaped upper terminal 110 being 5 to 12 along the arms in both directions may provide a greater ratio of magnetic field measurement sensitivity to resistance for the 2D vertical Hall cell 106 compared to other configurations, advantageously providing a desired balance of power consumption with sensitivity.

The instant example discloses a 2D vertical Hall cell having an n-type vertical Hall plate. A corresponding 2D vertical Hall cell having a p-type vertical Hall plate may be realized by appropriate changes of polarities of dopants and conductivity types. Another 2D vertical Hall cell having a vertical Hall plate of non-semiconductor resistive material is within the scope of the instant example.

Figure 2:
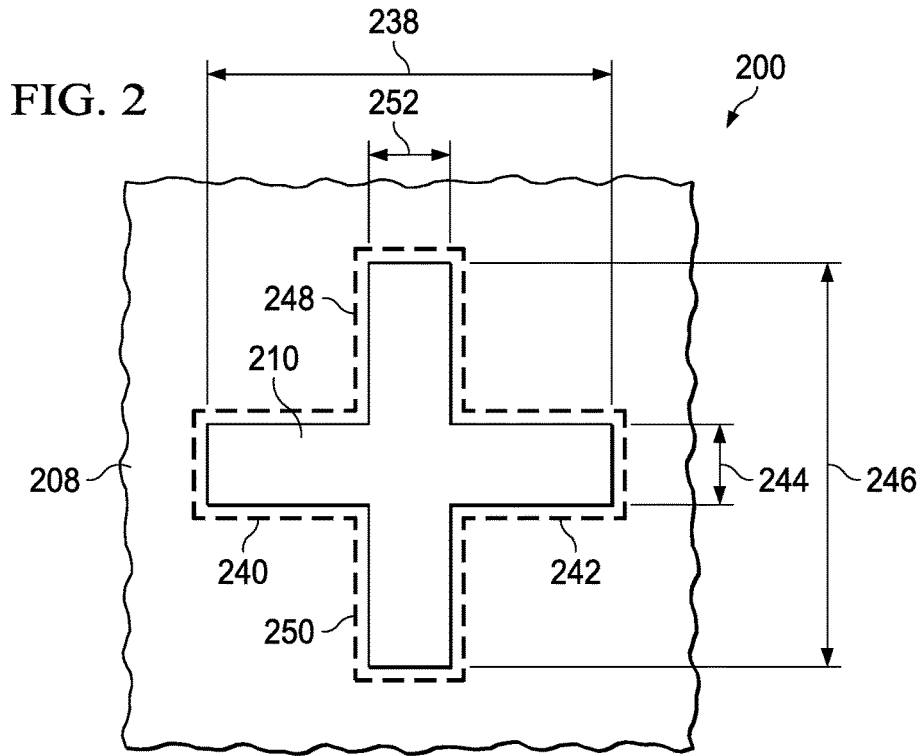
FIG. 2 is a top view of a cross-shaped upper terminal of an example 2D vertical Hall cell in a microelectronic device.

FIG. 2 is a top view of a cross-shaped upper terminal of an example 2D vertical Hall cell in a microelectronic device. The microelectronic device 200 has a vertical Hall plate 208 and a cross-shaped upper terminal 210 contacting the vertical Hall plate 208. A first length 238 of the cross-shaped upper terminal 210, in a plane of contact between the cross-shaped upper terminal 210 and the vertical Hall plate 208, from an end of a first arm 240 of the cross-shaped upper terminal 210 to an end of a second arm 242 of the cross-shaped upper terminal 210, is 5 to 12 times an average width 244 of the first and second arms 240 and 242. The second arm 242 is located opposite from the first arm 240. Similarly, a second length 246 of the cross-shaped upper terminal 210, in the plane of contact between the cross-shaped upper terminal 210 and the vertical Hall plate 208, from an end of a third arm 248 of the cross-shaped upper terminal 210 to an end of a fourth arm 250 of the cross-shaped upper terminal 210, is 5 to 12 times an average width 252 of the third and fourth arms 248 and 250. The third arm 248 is located opposite from the fourth arm 250. The third and fourth arms 248 and 250 are oriented perpendicular to the first and second arms 240 and 242.

Figure 3:
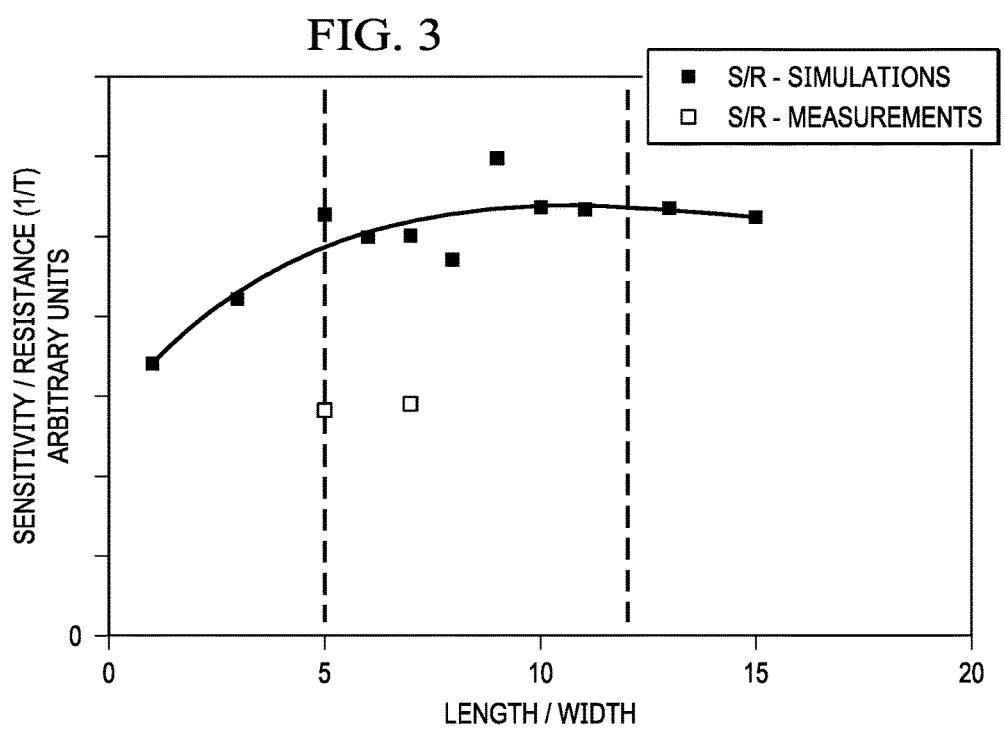
FIG. 3 is a chart of a ratio of magnetic field measurement sensitivity to resistance for example 2D vertical Hall cells.

FIG. 3 is a chart of a ratio of magnetic field measurement sensitivity to resistance for example 2D vertical Hall cells. The example 2D vertical Hall cells have similar structures to that disclosed in FIG. 1. The vertical axis of the chart marks the ratio of magnetic field measurement sensitivity to resistance, on a linear scale, of the 2D vertical Hall cells with varying arm lengths. The horizontal axis marks the ratio of length to width, on a linear scale, as defined in reference to FIG. 2, for the 2D vertical Hall cells. The solid data points in the chart are provided by numerical simulations of the 2D vertical Hall cells. The hollow data points are provided by electrical test results of fabricated microelectronic devices having the 2D vertical Hall cells. The solid data points and the hollow data points use the same scale on the vertical axis. A trend curve of the solid data points, depicted as a continuous curve in the chart, indicates the ratio of magnetic field measurement sensitivity to resistance attains a maximum value when the ratio of length to width has a value from 5 to 12. The measured data support the trend, in that the ratio of magnetic field measurement sensitivity to resistance is increasing as the ratio of length to width increases from approximately 5 to approximately 7.

Figure 4:
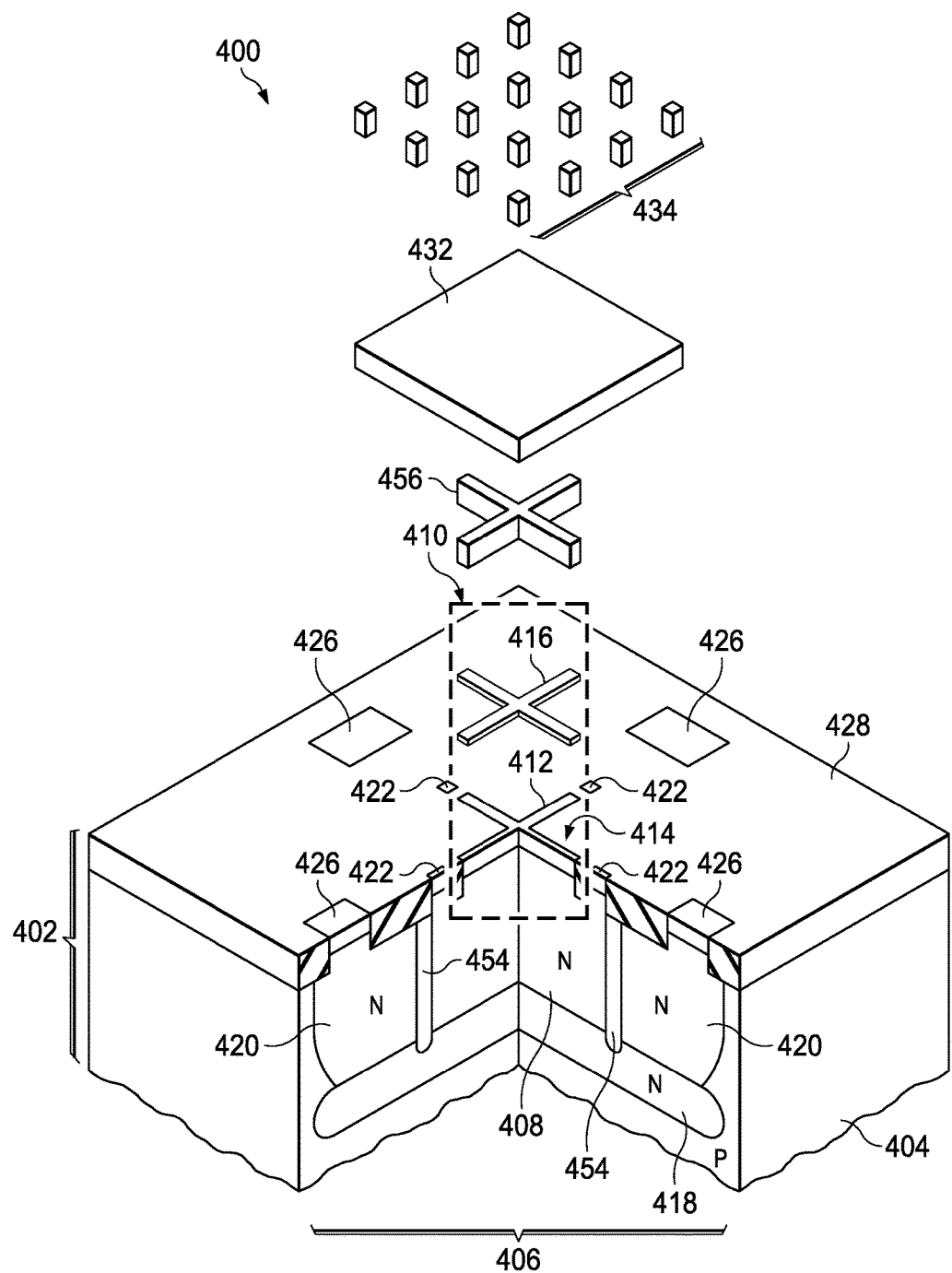
FIG. 4 is an exploded view of an example microelectronic device including a 2D vertical Hall cell.

FIG. 4 is an exploded view of an example microelectronic device including a 2D vertical Hall cell. The microelectronic device 400 includes a substrate 402 with semiconductor material 404, which may be p-type, as indicated in FIG. 4. Field oxide 428 may be disposed in the substrate 402.

The 2D vertical Hall cell 406 includes a vertical Hall plate 408 of semiconductor material in the substrate 402. In the instant example, the vertical Hall plate 408 may be n-type. The 2D vertical Hall cell 406 further includes a cross-shaped upper terminal 410 over the vertical Hall plate 408. In the instant example, the cross-shaped upper terminal 410 includes an upper contact region 412 of n-type semiconductor material, in the substrate 402, directly on the vertical Hall plate 408, extending to a top surface 414 of the substrate 402. The upper contact region 412 may have an average dopant density at least 100 times the average dopant density of the vertical Hall plate 408. The upper contact region 412 may have an average electrical conductivity at least 100 times an average electrical conductivity of the vertical Hall plate 408. In the instant example, the cross-shaped upper terminal 410 may also include metal silicide 416 directly on the upper contact region 412. The metal silicide 416 may extend over the upper contact region 412. A length of the cross-shaped upper terminal 410, where it contacts the vertical Hall plate 408, is 5 to 12 times an average width of arms of the cross-shaped upper terminal 410, as defined in reference to FIG. 1 and FIG. 2. The 2D vertical Hall cell 406 also includes a buried layer 418 of n-type semiconductor material in the substrate 402 under the vertical Hall plate 408. The buried layer 418 extends laterally past the vertical Hall plate 408 to current return regions 420 located in the substrate 402 outside of the vertical Hall plate 408. In one aspect of the instant example, the buried layer 418 may have an average dopant density at least 10 times greater than an average dopant density of the vertical Hall plate 408. In another aspect, the buried layer 418 may have an average electrical conductivity at least 10 times greater than an average electrical conductivity of the vertical Hall plate 408. The 2D vertical Hall cell 406 includes Hall sense taps 422 which are electrically coupled to the vertical Hall plate 408. The Hall sense taps 422 may have structures similar to that described in reference to the Hall sense taps 122 of FIG. 1.

The current return regions 420 of the instant example may include n-type semiconductor with an average dopant density at least 10 times greater than the average dopant density of the vertical Hall plate 408, to advantageously reduce a total resistance of the 2D vertical Hall cell 406. In the instant example, the current return regions 420 may extend from the buried layer 418 to return contact regions 426 of n-type semiconductor material. The current return regions 420 may be laterally isolated from the vertical Hall plate 408 by deep trenches 454 extending from the field oxide 428 to the buried layer 418. The deep trenches 454 may contain dielectric material such as silicon dioxide to electrically isolate the current return regions 420 from the vertical Hall plate 408. The deep trenches 454 may advantageously enable a reduced area for the 2D vertical Hall cell 406 compared to other isolation structures. Other structures for isolating the current return regions 420 from the vertical Hall plate 408, for example, structures having p-type semiconductor material, are within the scope of the instant example.

The 2D vertical Hall cell 406 of the instant example includes a cross-shaped contact 456 extending continuously on arms of the cross-shaped upper terminal 410. The cross-shaped contact 456 may advantageously provide more uniform current to the cross-shaped upper terminal 410 and thus to the vertical Hall plate 408 compared to discrete contacts.

The cross-shaped contact 456 may also reduce a total resistance of the 2D vertical Hall cell 406 compared to a similar cell using discrete vias. The 2D vertical Hall cell 406 may further include a metal pad 432 of a first interconnect level on the cross-shaped contact 456, and vias 434 distributed on the metal pad 432.

Figure 5A:
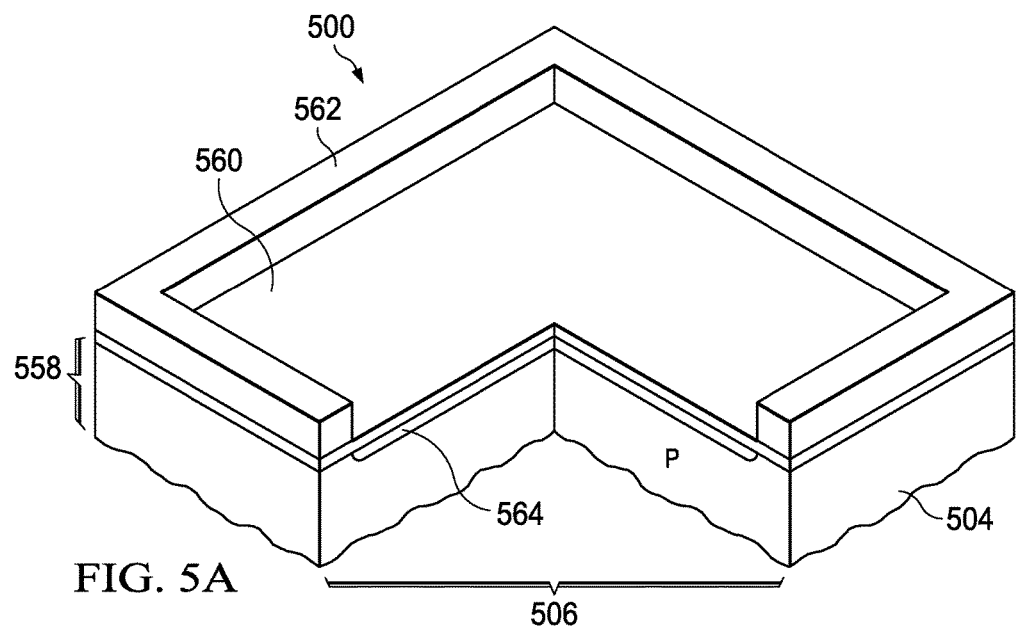
FIG. 5A through FIG. 5E are cross sections of a microelectronic device containing a 2D vertical Hall cell, depicted in stages of an example method of formation.

FIG. 5A through FIG. 5E are cross sections of a microelectronic device containing a 2D vertical Hall cell, depicted in stages of an example method of formation. Referring to FIG. 5A, formation of the microelectronic device 500 begins with provision of a base wafer 558 having p-type semiconductor material 504. A screen oxide layer 560 may be formed over the base wafer 558 to protect a top surface of the base wafer 558 during subsequent process steps. An implant mask 562 is formed over the base wafer 558, exposing an area for a buried layer in an area for the 2D vertical Hall cell 506. The implant mask 562 may include silicon dioxide or silicon nitride. A first dose of n-type dopants such as antimony or arsenic are implanted into the base wafer 558 where exposed by the implant mask 562, to form an implanted layer 564. The first dose of n-type dopants may be implanted with a dose greater than $1 \times 10^{15}$ cm$^{-2}$ to provide a desired high electrical conductivity for the buried layer. The implant mask 562 is subsequently removed.

Figure 5B:
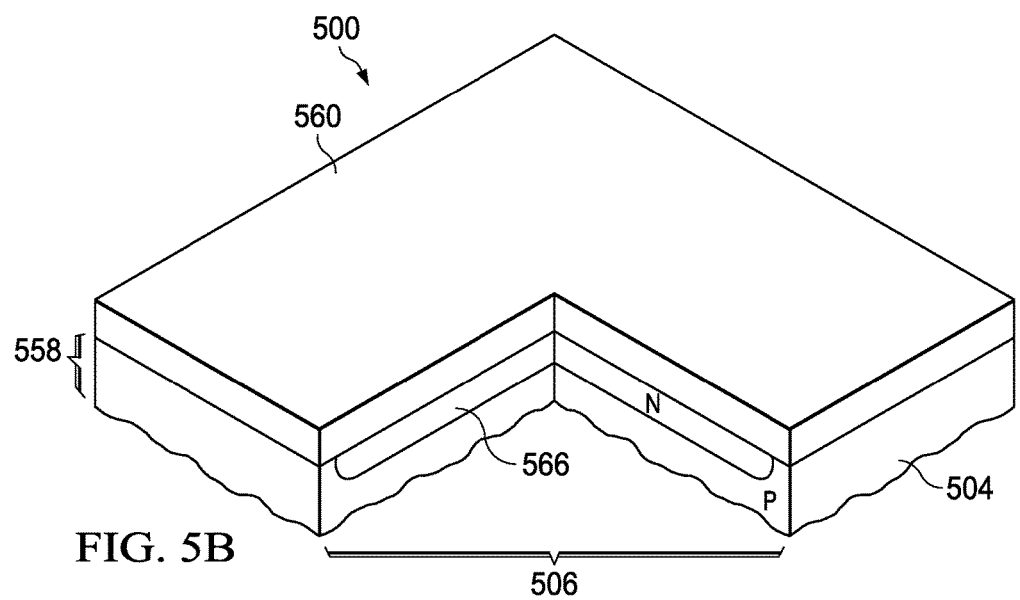

Referring to FIG. 5B, a thermal drive operation is performed which heats the base wafer 558, annealing the semiconductor material 504 and diffusing and activating the implanted n-type dopants in the implanted layer 564 of FIG. 5A to form an n-type diffused region 566. The thermal drive operation may have an oxidizing ambient including oxygen or water vapor, causing the screen oxide layer 560 to increase in thickness, as indicated in FIG. 5B. The screen oxide layer 560 is subsequently removed.

Figure 5C:
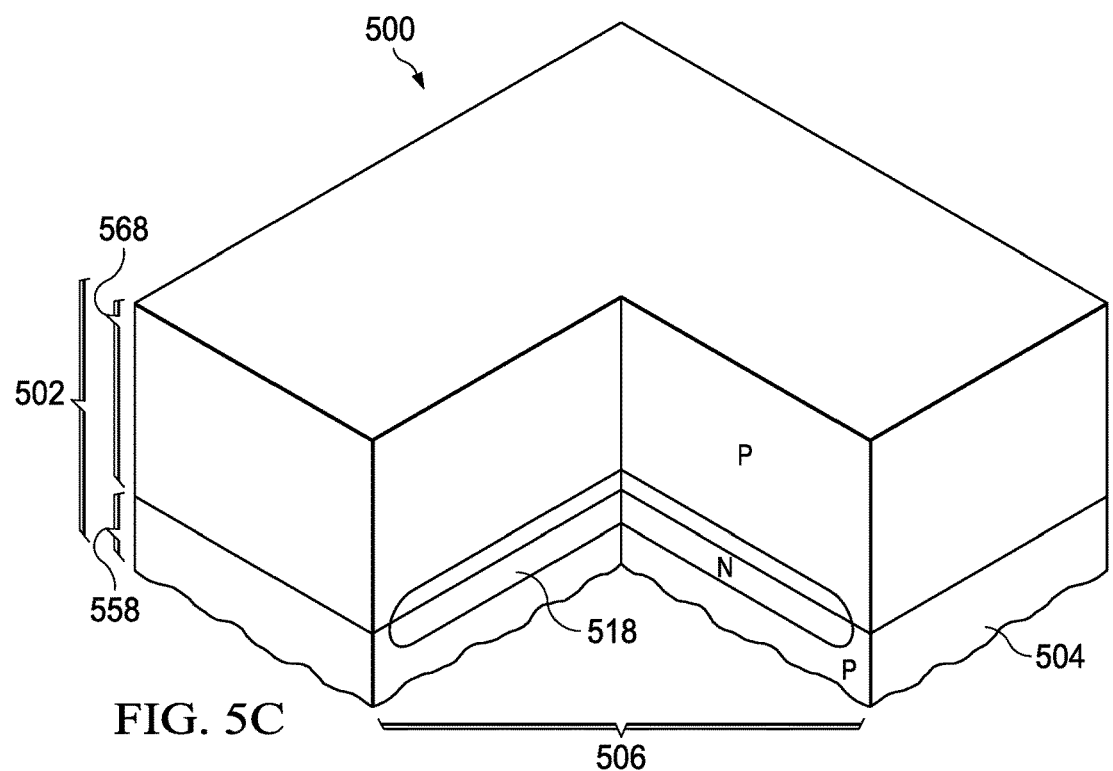

Referring to FIG. 5C, an epitaxial layer 568 of p-type semiconductor material is formed on the base wafer 558. A combination of the epitaxial layer 568 and the base wafer 558 provide a substrate 502 of the microelectronic device 500. The epitaxial layer 568 may be formed at a temperature which causes the n-type dopants in the n-type diffused region 566 of FIG. 5B to diffuse deeper into the base wafer 558 and also diffuse into the epitaxial layer 568, to form a buried layer 518. Alternatively, an anneal operation may be performed after the epitaxial layer 568 is formed, to diffuse the n-type dopants to form the buried layer 518. The anneal operation may be referred to as a thermal drive operation.

Figure 5D:
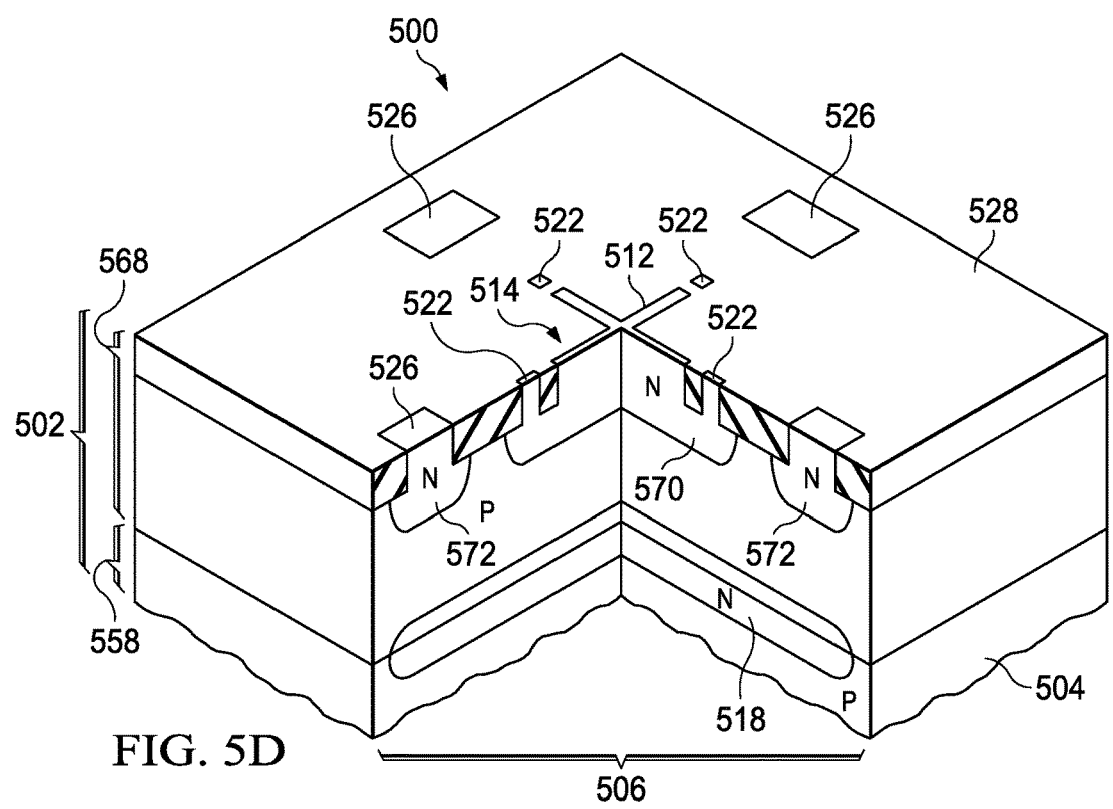

Referring to FIG. 5D, field oxide 528 is formed in the substrate 502, with openings for an upper contact region 512, Hall sense taps 522 outside of the upper contact region 512, and current return contact regions 526 outside of the Hall sense taps 522. In one version of the instant example, the field oxide 528 may be formed by an STI process, involving etching shallow trenches in the semiconductor material 504 and filling the trenches with silicon dioxide. In another version, the field oxide 528 may be formed by a LOCOS process, involving patterning a silicon nitride mask and growing thermal oxide in the exposed areas.

A second dose of n-type dopants such as phosphorus are implanted into the substrate 502 concurrently in an area for a vertical Hall plate of the 2D vertical Hall cell 506 and in areas for current return regions of the 2D vertical Hall cell 506. The second dose of n-type dopants may have a dose of $1 \times 10^{11}$ cm$^{-2}$ to $1 \times 10^{13}$ cm$^{-2}$, to provide a desired electrical conductivity for the vertical Hall plate. The implanted n-type dopants form a Hall plate implanted region 570 in the area for the vertical Hall plate, and form current return implanted regions 572 in the areas for the current returns. Implanting the n-type dopants to concurrently form the Hall plate implanted region 570 and the current return implanted regions 572 may advantageously reduce fabrication cost and complexity of the microelectronic device 500.

Figure 5E:
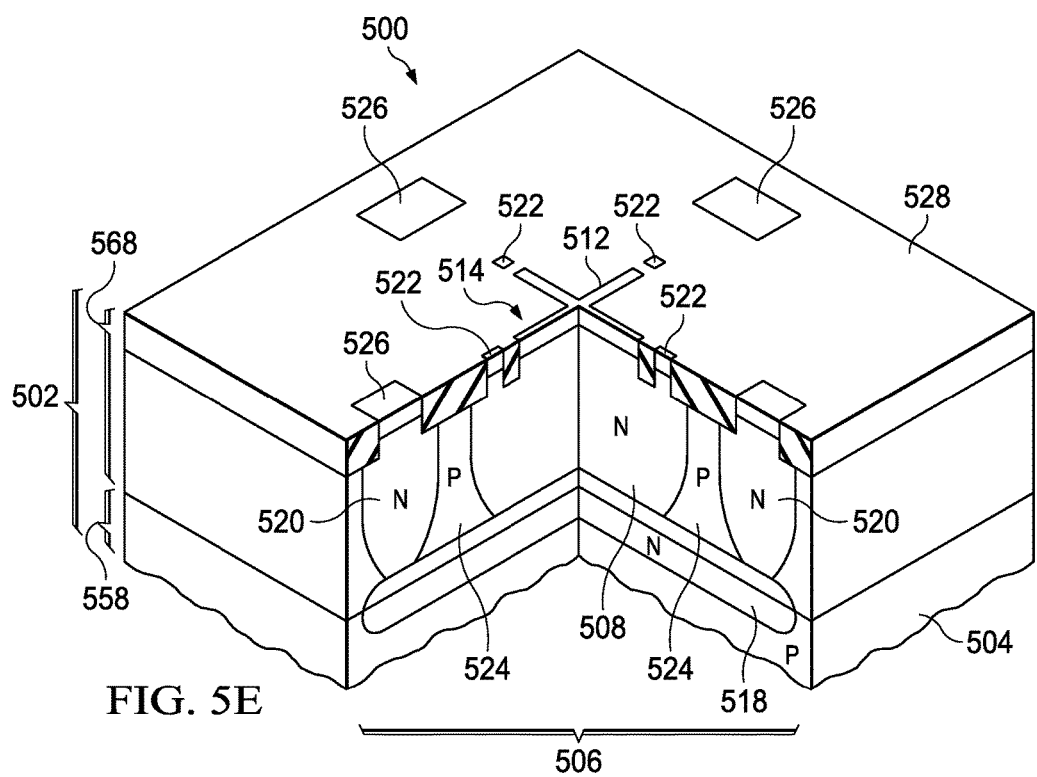

Referring to FIG. 5E, an anneal operation, also referred to as a thermal drive operation, is performed in which the substrate 502 is heated to diffuse the n-type dopants in the Hall plate implanted region 570 and the current return implanted regions 572 of FIG. 5D, to form the vertical Hall plate 508 and the current return regions 520, respectively. The current return regions 520 are laterally separated from the vertical Hall plate 508 by portions 524 of the epitaxial layer 568. The vertical Hall plate 508 and the current return regions 520 extend to the buried layer 518.

Figure 6A:
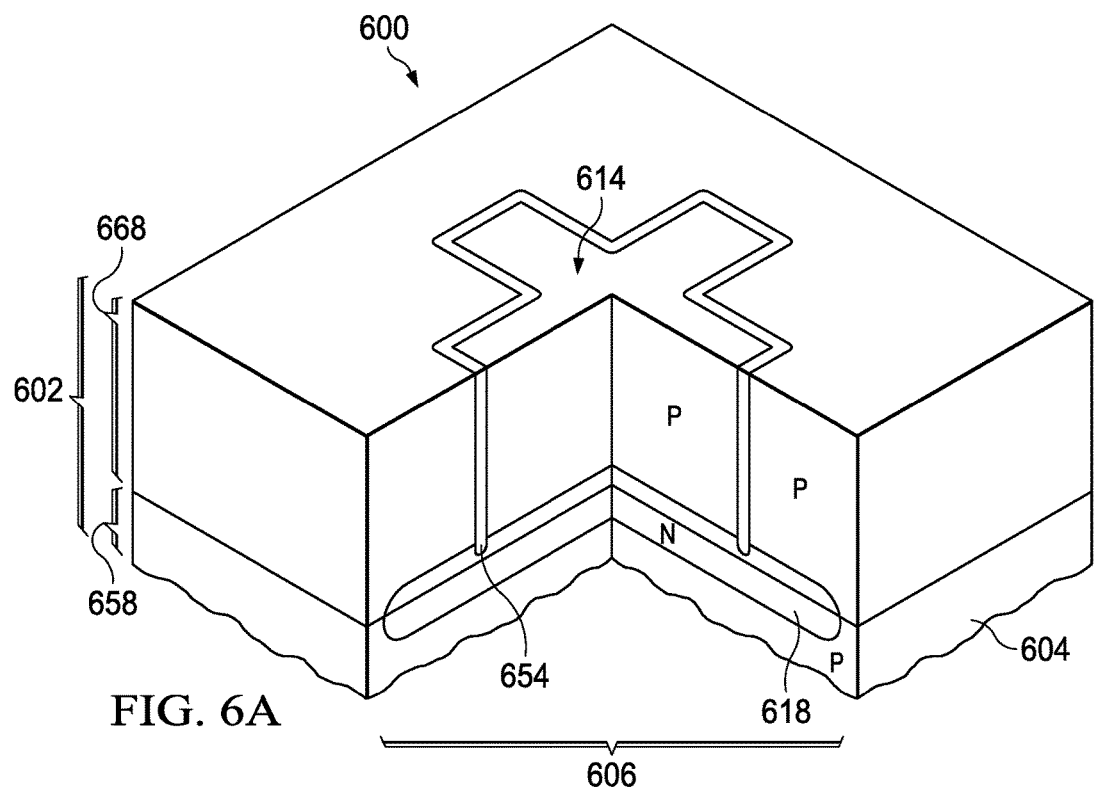
FIG. 6A through FIG. 6D are cross sections of a microelectronic device containing a 2D vertical Hall cell, depicted in stages of another example method of formation.

FIG. 6A through FIG. 6D are cross sections of a microelectronic device containing a 2D vertical Hall cell, depicted in stages of another example method of formation. Referring to FIG. 6A, formation of the microelectronic device 600 includes forming a buried layer 618 in a substrate 602 which includes a base wafer 658 and an epitaxial layer 668 on the base wafer 658. The buried layer 618 may be formed, for example, as described in reference to FIG. 5A through FIG. 5C. The base wafer 658 and the epitaxial layer 668 may include p-type semiconductor material 604, as indicated in FIG. 6A, while the buried layer 618 may include n-type material with an average dopant density greater than $1 \times 10^{19}$ cm$^{-3}$ to provide a desired high electrical conductivity for the buried layer 618.

A deep trench 654 is formed in the substrate 602, extending from a top surface 614 of the substrate 602 to the buried layer 618, enclosing a region for a vertical Hall plate of the 2D vertical Hall cell 606. The deep trench 654 may be formed, for example, by removing material from the substrate by a deep reactive ion etch (DRIE) process to form a trench and forming dielectric material, including thermal oxide, in the trench. The deep trench 654 may have a cross-shaped contour as shown in FIG. 6A to enhance current directionality in the vertical hall plate during operation of the microelectronic device 600. Alternatively, the deep trench 654 may have a round or square contour to provide additional process latitude when forming the dielectric material in the trench.

Figure 6B:
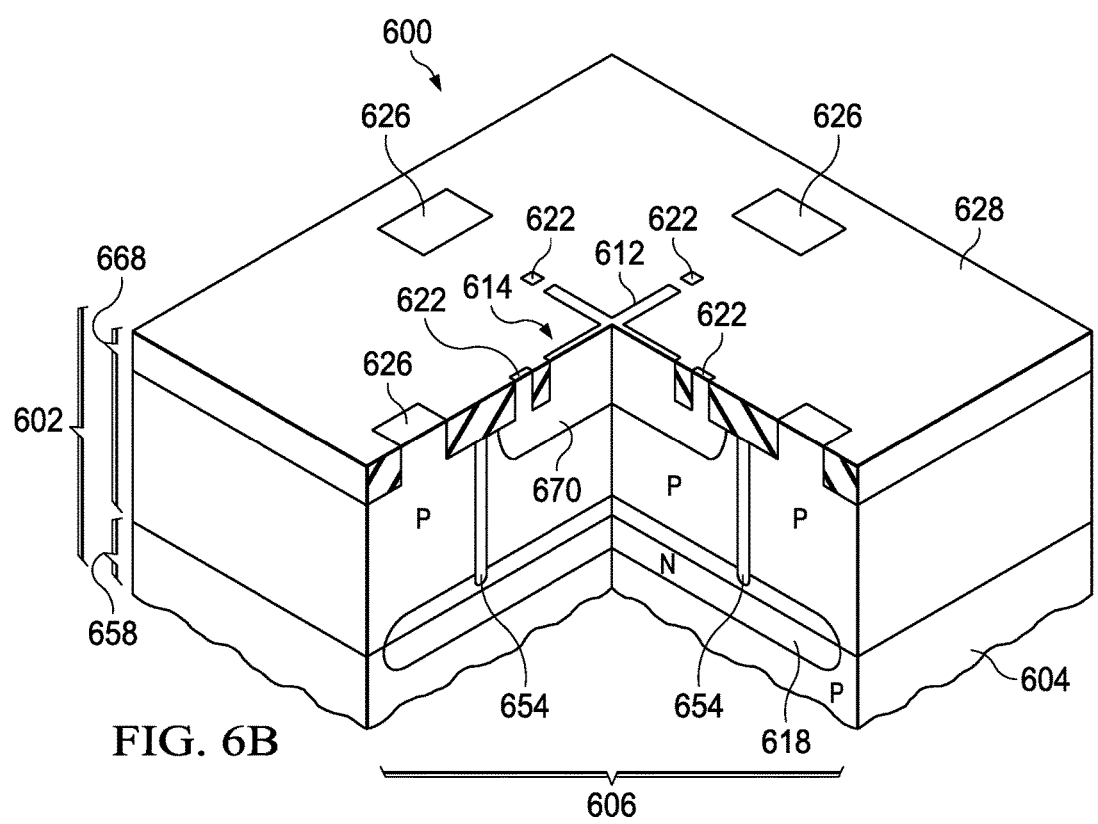

Referring to FIG. 6B, field oxide 628 is formed in the substrate 602, with openings for an upper contact region 612, Hall sense taps 622 outside of the upper contact region 612, and current return contact regions 626 outside of the Hall sense taps 622. A first dose of n-type dopants such as phosphorus is implanted into the epitaxial layer 668 in an area for the vertical Hall plate to form a Hall plate implanted region 670. The first dose of n-type dopants may have a dose of $1 \times 10^{11}$ cm$^{-2}$ to $1 \times 10^{13}$ cm$^{-2}$, to provide a desired electrical conductivity for the vertical Hall plate. The first dose of n-type dopants may optionally be implanted concurrently into areas for current return regions outside of the deep trench 654, to increase a total dopant density in the current returns.

Figure 6C:
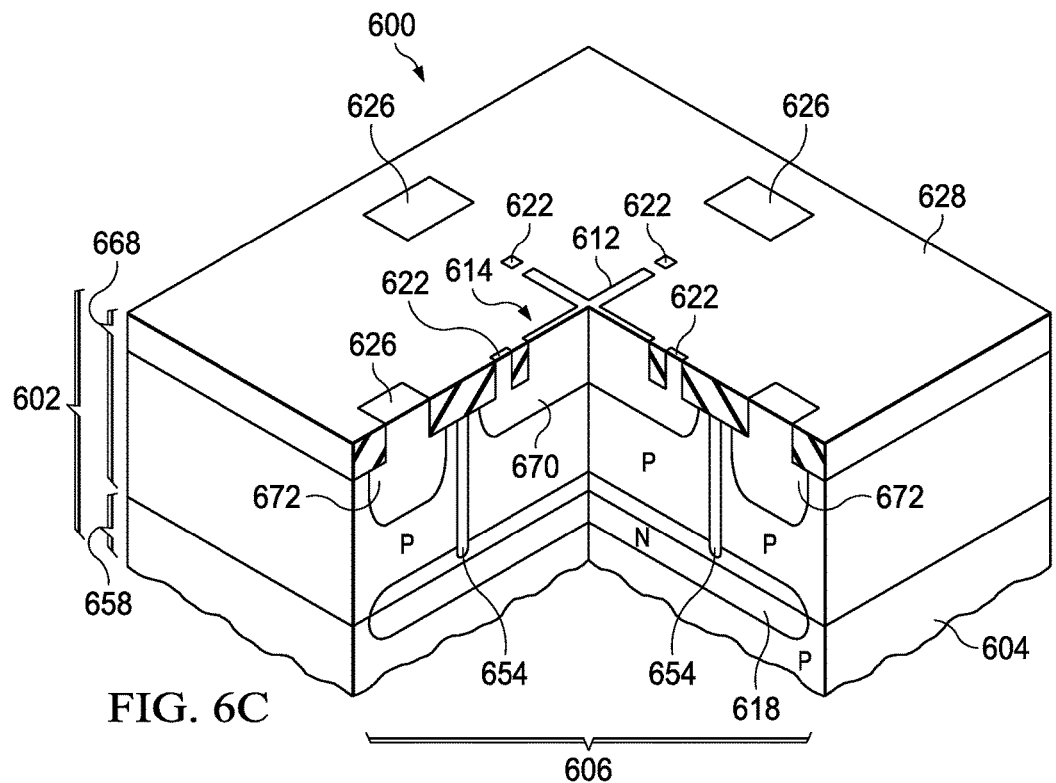

Referring to FIG. 6C, a second dose of n-type dopants such as phosphorus is implanted into the epitaxial layer 668 in areas for the current return regions to form current return implanted regions 672 outside of the deep trench 654. The second dose of n-type dopants may have a dose of $1 \times 10^{14}$ cm$^{-2}$ to $1 \times 10^{16}$ cm$^{-2}$, to provide a desired low electrical resistance for the subsequently-formed current returns.

Figure 6D:
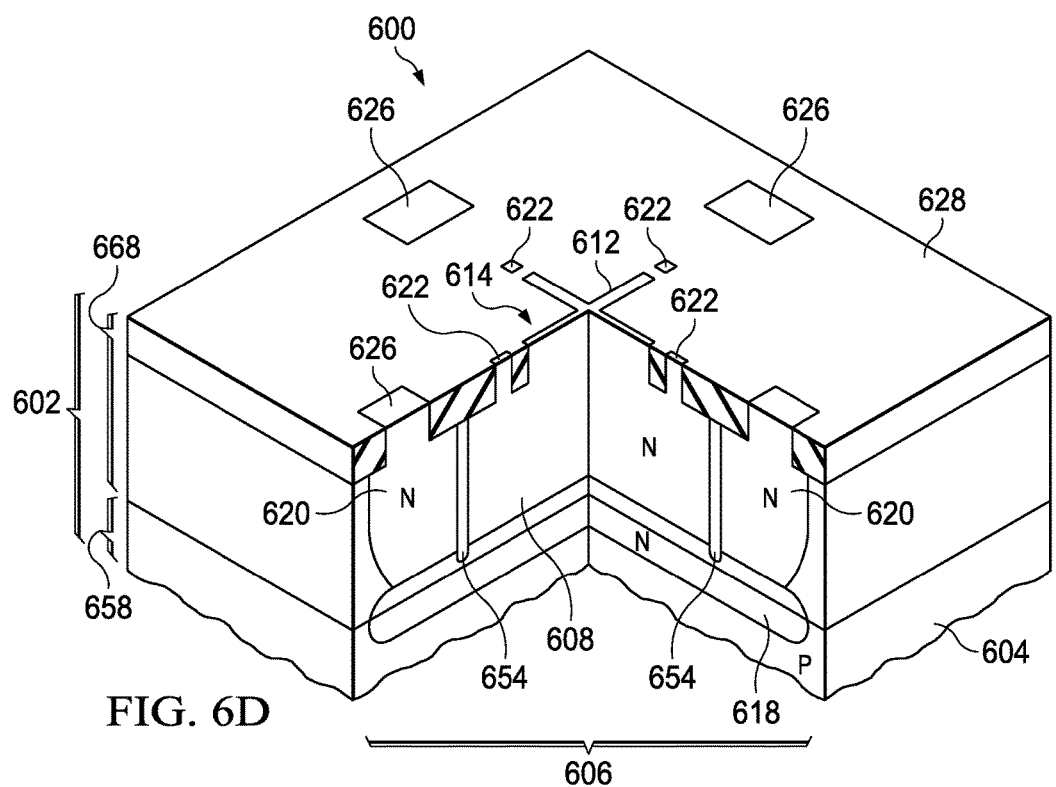

Referring to FIG. 6D, an anneal operation is performed in which the substrate 602 is heated to diffuse the n-type dopants in the Hall plate implanted region 670 and the current return implanted regions 672 of FIG. 5D, to form the vertical Hall plate 608 and the current return regions 620, respectively. The current return regions 620 are laterally separated from the vertical Hall plate 608 by the deep trench 654. Forming the vertical Hall plate 608 and the current return regions 620 with separate implant doses may advantageously provide a desired sensitivity and low resistance for the 2D vertical Hall cell 606.

Figure 7A:
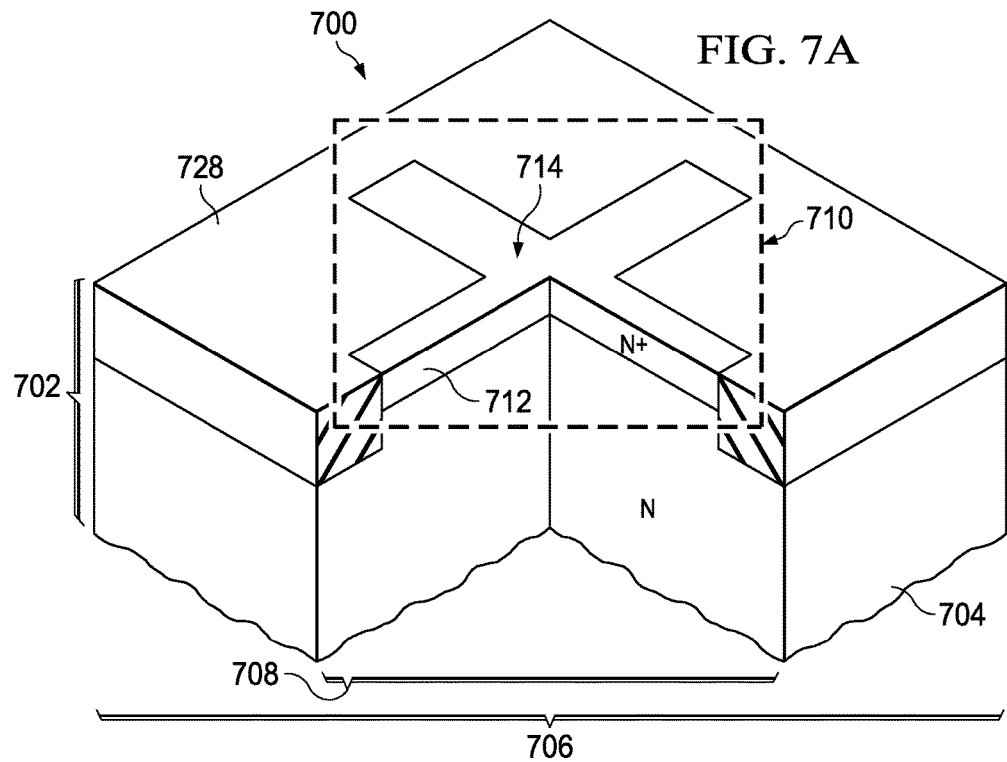
FIG. 7A through FIG. 7E are cross sections of a microelectronic device containing a 2D vertical Hall cell, depicted in stages of a further example method of formation.

FIG. 7A through FIG. 7E are cross sections of a microelectronic device containing a 2D vertical Hall cell, depicted in stages of a further example method of formation. Referring to FIG. 7A, a substrate 702 is provided for the microelectronic device 700; the substrate 702 includes semiconductor material 704 which extends to a top surface 714 of the substrate 702. A vertical Hall plate 708 of a 2D vertical Hall cell 706 is formed in the semiconductor material 704. The vertical Hall plate 708 may be formed, for example, as disclosed in reference to FIG. 5D and FIG. 5E, or in reference to FIG. 6B through FIG. 6D. In the instant example, the vertical Hall plate 708 may be n-type, as indicated in FIG. 7A, with an average dopant density of, for example, $5 \times 10^{15}$ cm$^{-3}$ to $5 \times 10^{16}$ cm$^{-3}$.

Field oxide 728 may be formed in the substrate 702 by an STI process or a LOCOS process. The field oxide 728 has an opening, also referred to as an active area, for an upper contact region 712 over the vertical Hall plate 708. The upper contact region 712 is part of a cross-shaped upper terminal 710 of the 2D vertical Hall cell 706. The upper contact region 712 has a same conductivity type as the vertical Hall plate 708, which, in the instant example, is n-type. The upper contact region 712 desirably has an electrical conductivity much greater, for example, at least 100 times greater, than the vertical Hall plate 708, to provide a uniform current density from the upper contact region 712 into the vertical Hall plate 708. The upper contact region 712 may thus have an average dopant density of $5 \times 10^{18}$ cm$^{-3}$ to $5 \times 10^{20}$ cm$^{-3}$. The upper contact region 712 may be formed by implanting n-type dopants, such as phosphorus and arsenic, into the substrate 702 with a dose of, for example, $3 \times 10^{14}$ cm$^{-2}$ to $3 \times 10^{16}$ cm$^{-2}$.

Figure 7B:
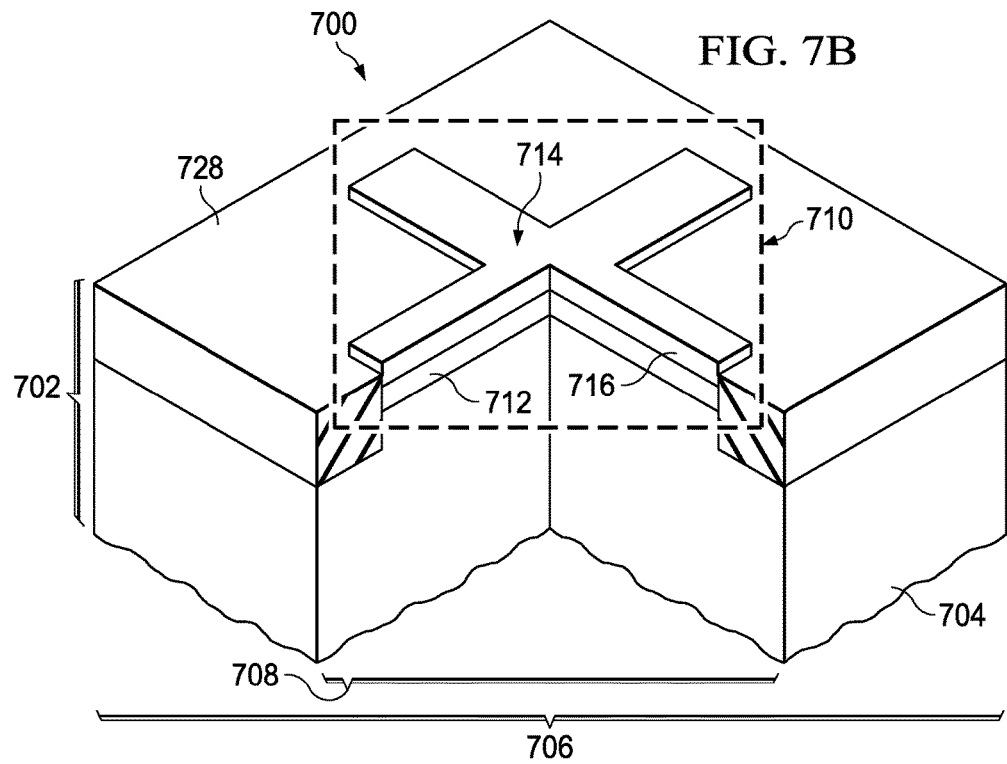

Referring to FIG. 7B, metal silicide 716 is formed on the upper contact region 712 as part of the cross-shaped upper terminal 710. An example process for forming the metal silicide 716 includes forming a layer of refractory metal such as platinum, titanium, nickel with a few percent platinum, or cobalt on the upper contact region 712 and the field oxide 728, so that the refractory metal contacts exposed silicon in the upper contact region 712. A cap layer of titanium nitride may be formed over the refractory metal to provide a diffusion barrier. The refractory metal is subsequently heated, for example, in a rapid thermal processor, to react the refractory metal with the exposed silicon to form the metal silicide 716. Unreacted refractory metal is subsequently removed, for example, by a wet etch using aqueous solutions of acidic or basic reagents. The metal silicide 716 may be subsequently annealed to provide a desired crystalline phase, for example, the C54 phase of titanium silicide. The metal silicide 716 desirably extends continuously across the upper contact region 712 at the top surface 714 of the substrate 702, which may further improve the uniformity of the current density from the upper contact region 712 into the vertical Hall plate 708.

Figure 7C:
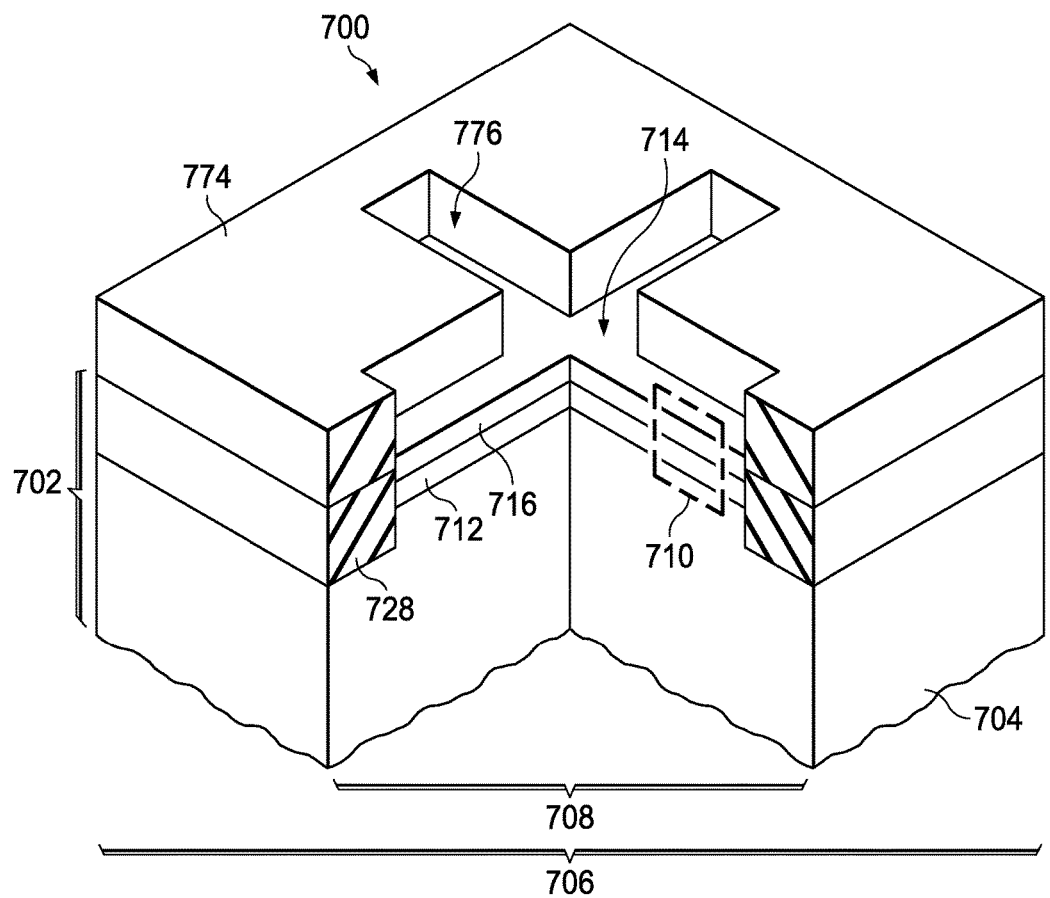

Referring to FIG. 7C, a dielectric layer 774 is formed over the field oxide 728 and the metal silicide 716. The dielectric layer 774 may be a pre-metal dielectric (PMD) layer 774 which includes one or more sub-layers of dielectric material, for example, a PMD liner of silicon nitride, a layer of silicon dioxide-based material formed by a high density plasma or a chemical vapor deposition (CVD) process using tetraethyl orthosilicate (TEOS) and ozone, a layer of silicon dioxide-based material such as phosphosilicate glass (PSG) or borophosphosilicate glass (BPSG), and a cap layer of silicon nitride, silicon oxynitride, silicon carbide or silicon carbide nitride.

A cross-shaped contact hole 776 is formed through the dielectric layer 774, exposing the metal silicide 716. In one version of the instant example, the cross-shaped contact hole 776 may be substantially coterminous with the metal silicide 716, as depicted in FIG. 7C. In another version, the cross-shaped contact hole 776 may extend past the metal silicide 716. In a further version, the cross-shaped contact hole 776 may be recessed from a lateral boundary of the metal silicide 716. The cross-shaped contact hole 776 may be formed by a reactive ion etch (RIE) process.

Figure 7D:
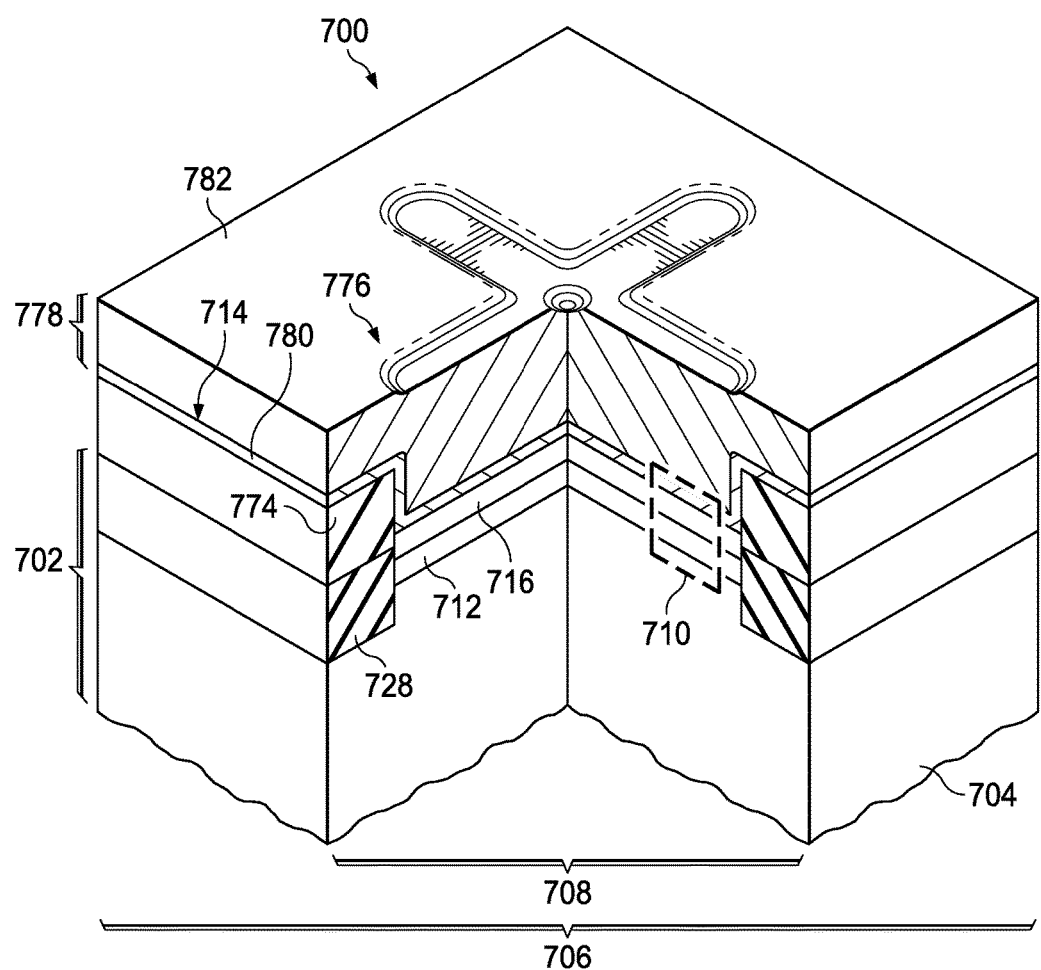

Referring to FIG. 7D, contact metal 778 is formed over the dielectric layer 774, extending into the cross-shaped contact hole 776 and making electrical contact with the metal silicide 716. The contact metal 778 may include a metal liner 780 on the dielectric layer 774 and the metal silicide 716, and a fill metal 782 on the metal liner 780. An example method of forming the metal liner 780 may include, for example, forming a titanium liner of the metal liner 780, by sputtering or an ionized metal plasma (IMP) process, on the dielectric layer 774 and extending into the cross-shaped contact hole 776, onto the metal silicide 716. A titanium nitride liner of the metal liner 780 is formed, by reactive sputtering or atomic layer deposition (ALD), on the titanium liner. The fill metal 782 may be formed by a two-step metal organic chemical vapor deposition (MOCVD) process using tungsten hexafluoride (WF6). In a first step of the two-step MOCVD process, the tungsten hexafluoride may be reduced by silane to avoid production of harmful amounts of hydrogen fluoride (HF) which may diffuse through the metal liner 780 and damage the dielectric layer 774. In a second step of the two-step MOCVD process, the tungsten hexafluoride may be reduced by hydrogen to provide more uniform filling of the cross-shaped contact hole 776.

Figure 7E:
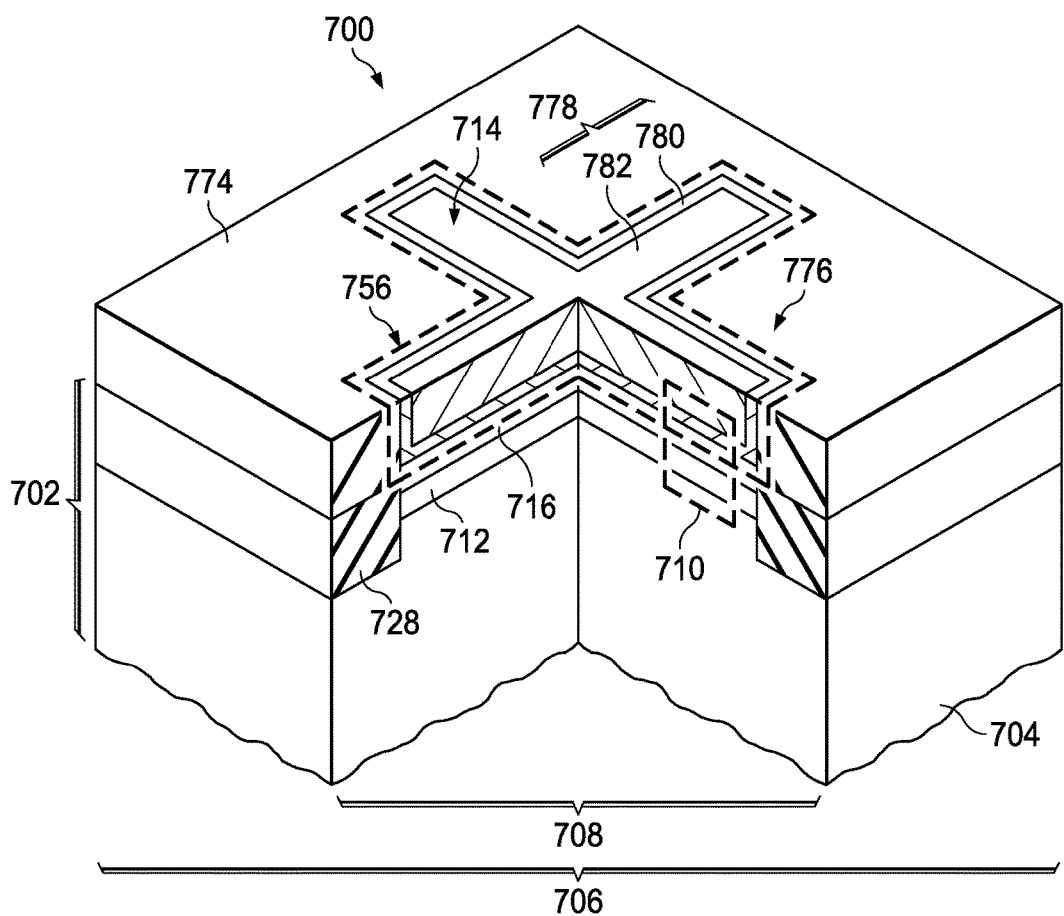

Referring to FIG. 7E, the contact metal 778 is removed from over the dielectric layer 774, leaving the contact metal 778 in the cross-shaped contact hole 776 to provide a cross-shaped contact 756 on the cross-shaped upper terminal 710. The contact metal 778 may be removed from over the dielectric layer 774 by an etchback process, or a metal chemical mechanical polish (CMP) process, or a combination thereof. The cross-shaped contact 756 may advantageously improve the uniformity of the current density from the upper contact region 712 into the vertical Hall plate 708.

Figure 8:
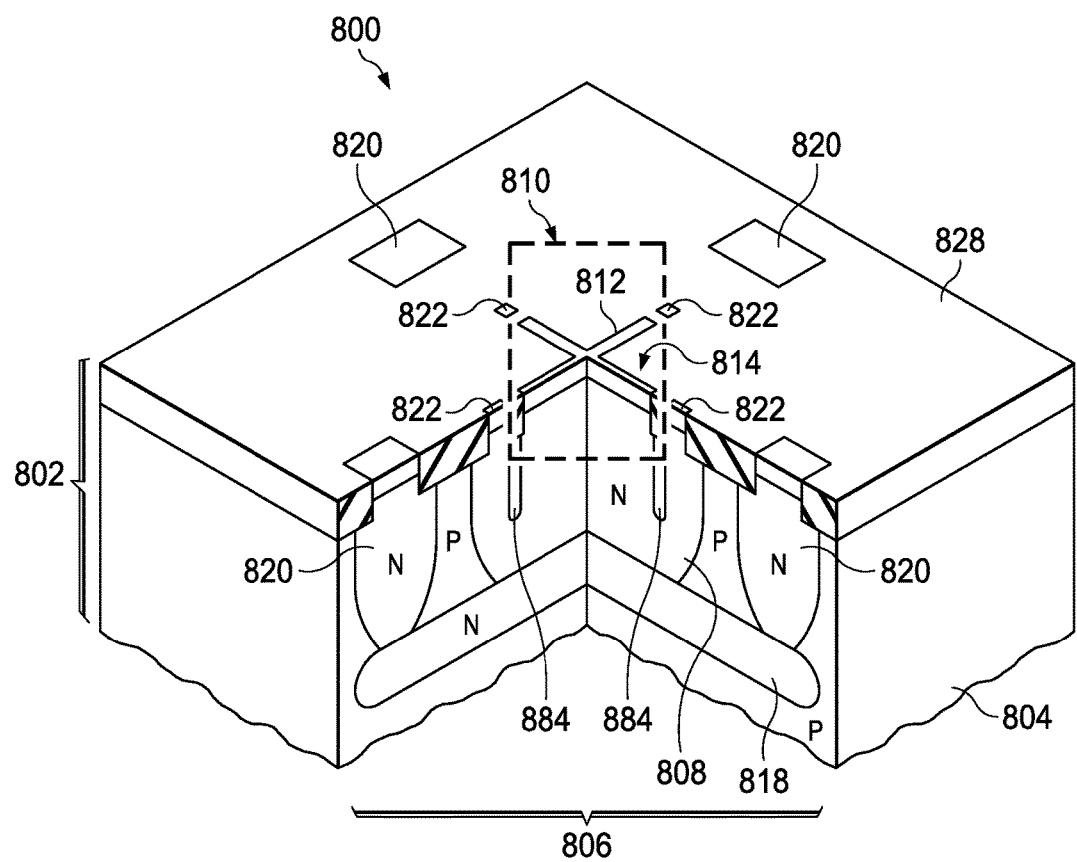
FIG. 8 is an exploded view of a further example microelectronic device including a 2D vertical Hall cell.

FIG. 8 is an exploded view of a further example microelectronic device including a 2D vertical Hall cell. The microelectronic device 800 includes a substrate 802 with semiconductor material 804, which may be p-type, as indicated in FIG. 4. Field oxide 828 may be disposed in the substrate 802. The 2D vertical Hall cell 806 includes a vertical Hall plate 808 of semiconductor material in the substrate 802. In the instant example, the vertical Hall plate 808 may be n-type. The vertical Hall plate 808 may have a higher dopant density close to the top surface 814 of the substrate 802 than close to the buried layer 818, as a result of being formed by implanting n-type dopants and diffusing the dopants to the buried layer 818 by a thermal drive operation.

The 2D vertical Hall cell 806 includes a cross-shaped upper terminal 810 over the vertical Hall plate 808. In the instant example, the cross-shaped upper terminal 810 includes an upper contact region 812 of n-type semiconductor material, in the substrate 802, directly on the vertical Hall plate 808, extending to a top surface 814 of the substrate 802. A length of the cross-shaped upper terminal 810, where it contacts the vertical Hall plate 808, is 5 to 12 times an average width of arms of the cross-shaped upper terminal 810, as defined in reference to FIG. 1 and FIG. 2. The 2D vertical Hall cell 806 also includes a buried layer 818 of n-type semiconductor material in the substrate 802 under the vertical Hall plate 808. The buried layer 818 extends laterally past the vertical Hall plate 808 to current return regions 820 located in the substrate 802 outside of the vertical Hall plate 808.

In the instant example, the 2D vertical Hall cell 806 includes Hall sense taps 822 at the top surface 814 of the substrate 802 around a periphery of the vertical Hall plate 808. The Hall sense taps 822 are electrically coupled to the vertical Hall plate 808 at a vertical location that is closer to the buried layer 818 than to the top surface 814 of the substrate 802. Isolation trenches 884 extend into the substrate 802 partway to the buried layer 818, between the Hall sense taps 822 and the cross shaped upper terminal 810, so that Hall sense taps 822 are electrically coupled to the vertical Hall plate 808 below bottoms of the isolation trenches 884. The isolation trenches 884 may have dielectric liners of thermal silicon dioxide, and may be filled with silicon dioxide formed by a plasma enhanced chemical vapor deposition (PECVD) process, or by polycrystalline silicon formed by thermal decomposition of silane. The vertical Hall plate 808 may have a lower dopant density at the bottom of the isolation trenches 884 than immediately under the field oxide 828, due to the dopant distribution of the vertical Hall plate 808. Electrically coupling the Hall sense taps 822 to the vertical Hall plate 808 at a position having a lower dopant density may improve the sensitivity of the 2D vertical Hall cell 806, as sensitivity tends to increase as the dopant density is reduced.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
   a substrate;
   a two-dimensional (2D) vertical Hall cell, comprising:
      a vertical Hall plate in the substrate;
      a cross-shaped upper terminal contacting a top of the vertical Hall plate;
      a buried layer contacting a bottom of the vertical hall plate;
      Hall sense taps outside the cross-shaped upper terminal, the Hall sense taps being electrically coupled to the vertical Hall plate; and
      current return regions in the substrate outside of the vertical Hall plate, the current return regions comprising semiconductor material having a same conductivity type as the buried layer, the current return regions being electrically coupled to the buried layer, wherein the current return regions extend upward from the buried layer toward a top surface of the substrate.

2. The microelectronic device of claim 1, wherein the cross-shaped upper terminal includes an upper contact region including n-type semiconductor material.

3. The microelectronic device of claim 2, wherein the upper contact region has an average electrical conductivity at least 100 times greater than an average electrical conductivity of the vertical Hall plate.

4. The microelectronic device of claim 3, wherein an average dopant density of the n-type semiconductor material in the upper contact region is $5 \times 10^{18}$ cm$^{-3}$ to $5 \times 10^{20}$ cm$^{-3}$.

5. The microelectronic device of claim 1, wherein the cross-shaped upper terminal includes metal silicide.

6. The microelectronic device of claim 1, further comprising contacts on the cross-shaped upper terminal, wherein the contacts extend to ends of the cross-shaped upper terminal.

7. The microelectronic device of claim 1, further comprising a cross-shaped contact on the cross-shaped upper terminal.

8. The microelectronic device of claim 1, wherein the buried layer includes n-type semiconductor material having an average dopant density at least 10 times greater than an average dopant density of the vertical Hall plate.

9. The microelectronic device of claim 1, wherein the Hall sense taps are electrically coupled to the vertical Hall plate at a vertical location closer to the buried layer than to a top surface of the substrate.

10. The microelectronic device of claim 1, wherein the current return regions have a dopant distribution similar to a dopant distribution of the vertical Hall plate.

11. The microelectronic device of claim 1, wherein the current return regions have an average dopant density at least 10 times greater than an average dopant density of the vertical Hall plate.

12. The microelectronic device of claim 1, wherein the current return regions are laterally isolated from the vertical Hall plate by semiconductor material having an opposite conductivity type from the current returns.

13. The microelectronic device of claim 1, wherein the current return regions are laterally isolated from the vertical Hall plate by a deep trench including dielectric material, the deep trench extending to the buried layer.

14. The device of claim 1, wherein the cross-shaped upper terminal has a length-to-width ratio of 5 to 12 where it contacts the vertical Hall plate, the length being measured from an end of a first arm of the cross-shaped upper terminal to an opposite end of a second, opposite, arm of the cross-shaped upper terminal, the width being an average width of the first arm and the second arm.

15. A method, comprising:
   providing a substrate which includes a semiconductor material;
   forming a buried layer in the substrate;
   forming a vertical Hall plate in the substrate on the buried layer;
   forming Hall sense taps outside of the cross-shaped upper terminal; and
   current return regions in the substrate outside of the Hall sense taps, the current return regions extending from the buried layer upward toward a top surface of the substrate, wherein the current return regions are laterally separated from the vertical Hall plate.

16. The method of claim 15, wherein forming the cross-shaped upper terminal includes forming an upper contact region having a cross shape contacting the vertical Hall plate, wherein the upper contact region has a same conductivity type as the vertical Hall plate, and the upper contact region has an average dopant density at least 100 times greater than an average dopant density of the vertical Hall plate.

17. The method of claim 16, wherein forming the cross-shaped upper terminal includes forming metal silicide on the upper contact region.

18. The method of claim 15, further comprising forming a cross-shaped contact on the cross-shaped upper terminal.

19. The method of claim 15, wherein the vertical Hall plate includes n-type semiconductor material.

20. The method of claim 15, further comprising forming a cross-shaped upper terminal on the vertical hall plate, wherein the cross-shaped upper terminal has a length-to-width ratio of 5 to 12 where it contacts the vertical Hall plate, the length being measured from an end of a first arm of the cross-shaped upper terminal to an opposite end of a second, opposite, arm of the cross-shaped upper terminal, the width being an average width of the first arm and the second arm.

* * * * *